(12) United States Patent
Dhanwada et al.

(10) Patent No.: US 6,799,309 B2
(45) Date of Patent: Sep. 28, 2004

(54) METHOD FOR OPTIMIZING A VLSI FLOOR PLANNER USING A PATH BASED HYPER-EDGE REPRESENTATION

(75) Inventors: Nagashyamala R. Dhanwada, Wappingers Falls, NY (US); Glenn E. Holmes, Wappingers Falls, NY (US); Joseph K. Morrell, Wappingers Falls, NY (US); Jose Luis P. Correia Neves, Poughkeepsie, NY (US); Natesan Venkateswaran, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 34 days.

(21) Appl. No.: 10/309,654

(22) Filed: Dec. 4, 2002

(65) Prior Publication Data

US 2004/0111687 A1 Jun. 10, 2004

(51) Int. Cl.$^7$ ............................................... G06F 17/50
(52) U.S. Cl. ................................. 716/8; 716/9; 716/10; 716/11
(58) Field of Search ........................... 716/8, 9, 10, 11

(56) References Cited

U.S. PATENT DOCUMENTS

| | | | |
|---|---|---|---|
| 4,967,367 A | * 10/1990 | Piednoir | ........................ 716/2 |
| 5,311,443 A | * 5/1994 | Crain et al. | .................... 716/10 |
| 5,838,583 A | * 11/1998 | Varadarajan et al. | ........... 716/9 |
| 6,477,683 B1 | * 11/2002 | Killian et al. | .................. 716/1 |
| 6,600,341 B2 | * 7/2003 | Bingert et al. | .............. 326/102 |
| 6,651,235 B2 | * 11/2003 | Dai et al. | ....................... 716/7 |

* cited by examiner

Primary Examiner—Stacy A. Whitmore
Assistant Examiner—Sun James Lin
(74) Attorney, Agent, or Firm—H. Daniel Schnurmann

(57) ABSTRACT

An abstraction based multi-phase method for VLSI chip floorplanning is described. The abstraction based approach provides a solution to macro floorplanning in the presence of leaf level intermediate logic, and achieves it without loss of accuracy in the results. Annotations generated during abstraction are presented as floorplanning constraints which account for the abstracted data. The floorplanning and placement algorithms handle detailed netlists consisting of large blocks and small leaf level cells in an efficient manner. The abstraction based approach phases out by abstracting the leaf level logic (thus reducing the solution space of the floorplanner) and reintroducing them in the form of floorplan constraints (to account for the presence of the leaf level logic while determining the location of large blocks). The abstraction and bundling phases achieves a significant improvement in the performance of a simulated annealing based floorplanner. The overall concept of driving a floorplanning algorithm with a path based hyper-edge representation also helps to provide structural information about the netlist to the floorplanner.

9 Claims, 7 Drawing Sheets

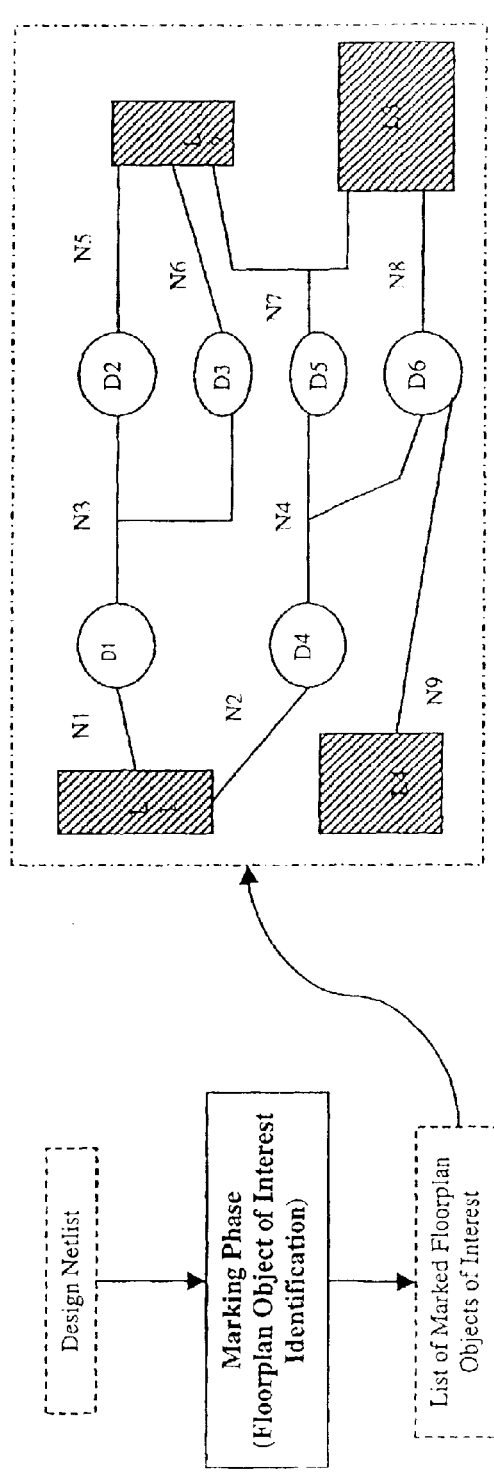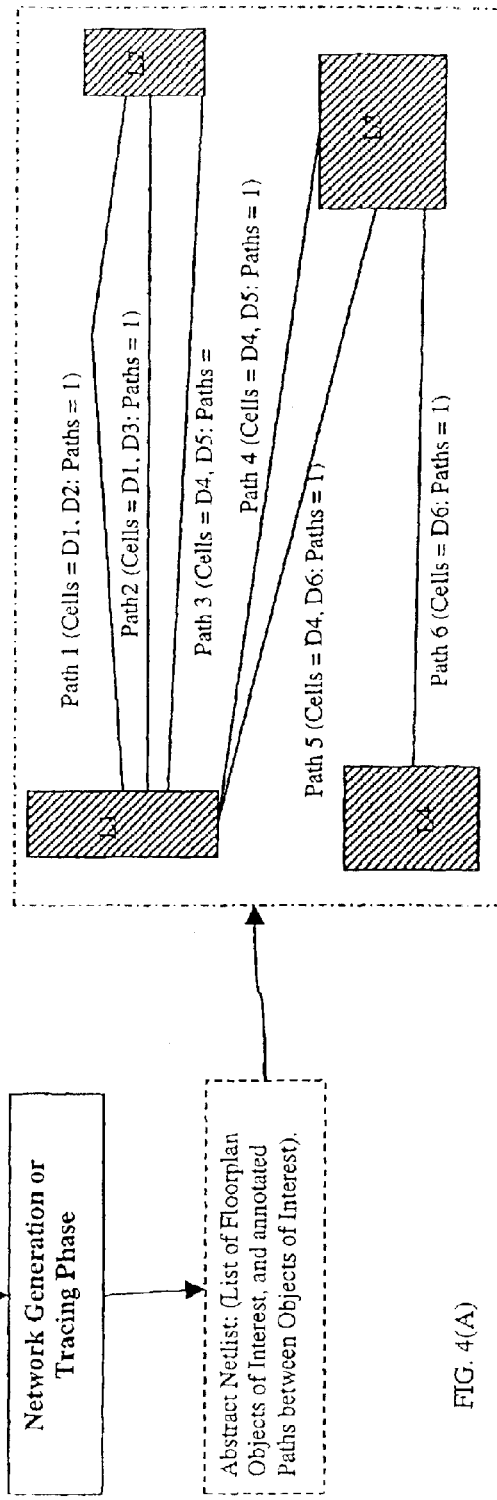

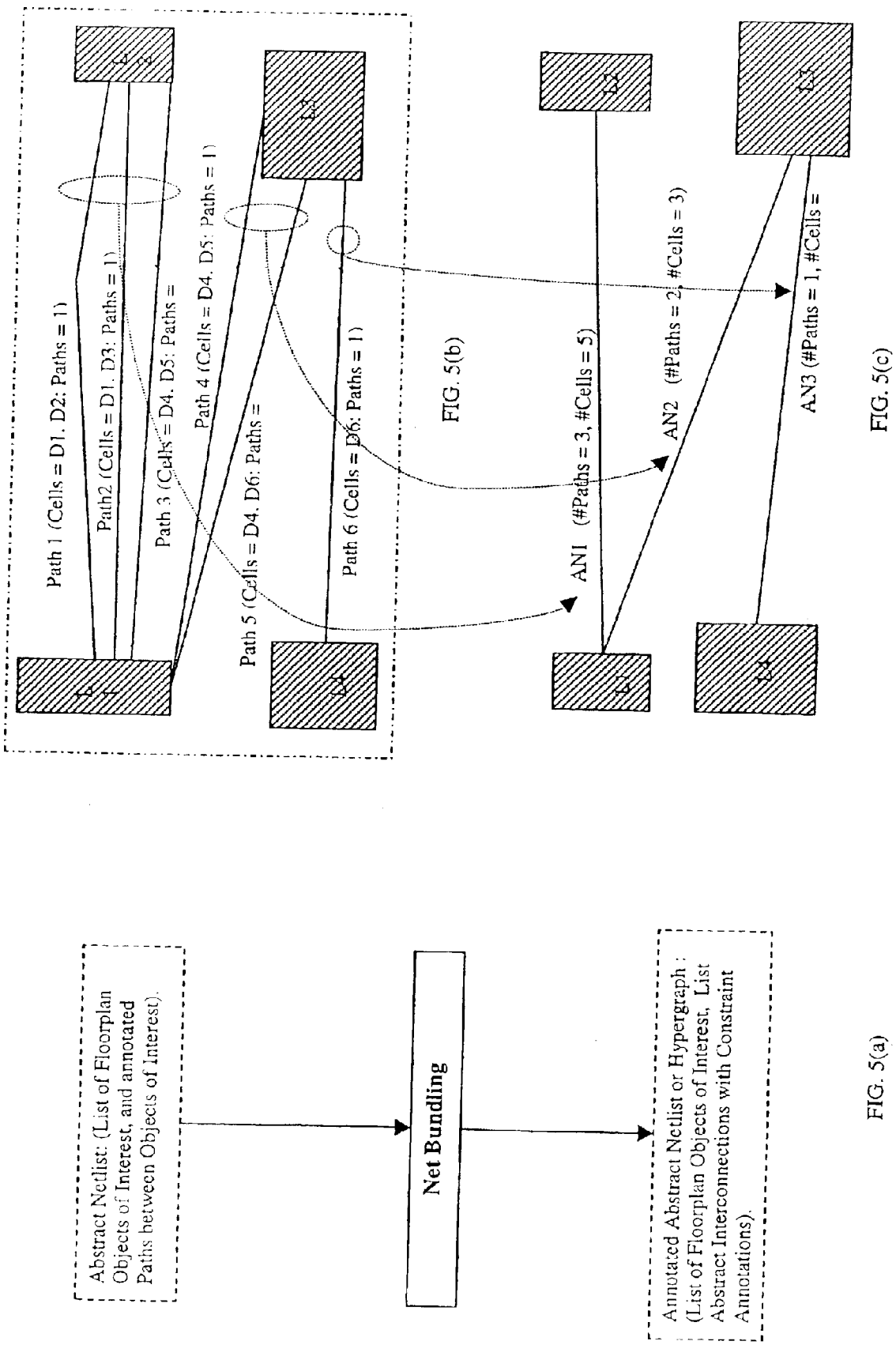

METHOD FOR OPTIMIZING A VLSI FLOOR PLANNER USING A PATH BASED HYPER-EDGE REPRESENTATION

FIELD OF THE INVENTION

This invention is related to the field of design automation of VLSI chips, and more particularly, to a method of reducing the complexity of a floorplanner by solving the mix of large blocks and cell placement while preserving the accuracy of the floorplanner.

BACKGROUND OF THE INVENTION

With the increasing size and complexity of VLSI (Very Large Scale Integrated) circuit designs, the physical design task of floorplanning is gaining more relevance in today's design methodologies. These designs consist of a mix of large cells (the height of the object spanning over several circuit rows) and smaller ones. A VLSI design is represented by a netlist consisting of a set of blocks, large and small, interconnected by nets. (Nets can be viewed as wires or interconnections that link the various blocks in the design). A block may be a hard block, whose area and shape are already fixed, or a soft block consisting of smaller cells, and whose area and shape are flexible. Examples of large hard blocks are register arrays, memories, and the like. The blocks may also be small leaf level gates within the design, commonly referred to as leaf level cells. Floorplanning determines the best placement of the large blocks. Blocks that are to be placed on the layout by the floorplanner are termed "floorplan objects of interest" or simply large blocks A typical approach to determine the best location of large blocks in a netlist consisting of a mixture of large blocks and small leaf level cells is to first group the smaller leaf level cells into large blocks. By way of example, the original netlist (consisting of large blocks and small leaf cells) is transformed, by performing some sort of clustering/partitioning, into a netlist consisting of large blocks.

Given a flat VLSI netlist, the step of creating flexible blocks from small leaf cells in the design amounts to creating a level of hierarchy therein. This step is achieved by grouping a set of cells into a separate flexible block. Grouping introduces extra floorplan objects of interest into the design. This type of explicit hierarchy creation has its own drawbacks since it introduces extra steps in the design process, potentially increasing the turnaround time (TAT) of the design.

When a transformed netlist is made of large blocks or floorplan objects of interest, the task of determining their locations on the layout can be done manually based on the design's architectural constraints or automatically. In the latter case, algorithmic techniques for global optimization are used, such as simulated annealing driven by a cost function that minimizes objectives like the total wire length between the large blocks. The term simulated annealing is derived from an analogous physical process of heating and then slowly cooling a substance to obtain a strong crystalline structure. In simulated annealing, the minimum cost function corresponds to the ground state of the substance. The simulated annealing process lowers the temperature in slow stages until the system "freezes", after which no further changes occur. To apply simulated annealing, the system is initialized with a particular configuration. A new configuration is constructed by imposing a random displacement. If the energy of the new state is lower than the previous one, the change is accepted unconditionally and the system is updated. If the energy is greater, the new configuration is accepted probabilistically. More details regarding this technique are found in the article "Optimization by Simulated Annealing" by Kirkpatrick, Gellatt and Vecchi, published in the 1983 edition of Science. Subsequent placement of the leaf level cells is sensitive to the quality of the floorplan (location of large blocks in the design). Thus, achieving a good initial floorplan is critical for obtaining high quality final placement solutions.

Conventional floorplanning uses a representation wherein intermediate leaf levels cells are clustered to form the nodes of the netlist amounting to the previously stated creation of a hierarchical level. However, these do not describe a methodology wherein the abstracted cells are represented as abstract interconnections with constraint annotations (that helps to preserve the potential signal path behavior of the design), and which efficiently drives the optimization floorplanning algorithm with a path based abstract interconnection representation. (Abstract interconnections are referred as such because they do not exist in the given netlist, but are introduced in the present invention in order to account for intermediate leaf cells and related nets that were removed from the original netlist. Abstract interconnections will also be referred to hereinafter as abstract hyper-edges or abstract nets. A hyper-edge is a known term used in graph theory to indicate a connection between multiple nodes in a graph).

Simulated annealing has been used in the art as an effective floorplanning algorithm because of its ability to handle various constraints, such as block shapes, I/O constraints, etc. This technique belongs to a class of algorithms called "hill-climbing algorithms" that have the ability of finding near-optimal solutions to the problem on hand. However, the algorithm requires vast amounts of computational resources and is inherently slow. The algorithm is an iterative improvement algorithm. In each iteration, several solutions are generated by perturbing the initial solution. Then, the quality of the solutions is evaluated, the measure of quality forming the basis for their acceptance or rejection. A cost function is finally used to compute this measurement.

Some reasons for the inherent slowness of the annealer arise from the near-exhaustive nature of the solution space being contemplated, and from the time taken for evaluating the quality of the solution. The floorplanner that is used in the abstraction based flow is based on simulated annealing. In this context, novel techniques to reduce the complexity of an annealing based floorplanner working within a path based abstraction flow will also be described in the present invention hereinafter.

Referring to FIG. 1, the outline of a conventional physical design methodology is shown. The chip physical design step starts with floorplanning. The task of floor-planning results in associating coordinate locations to floorplan objects of interest on the two-dimensional region representing the chip layout.

Upon completion of the floorplanned design, the next step of placement results in associating specific coordinate locations for all remaining design objects in the netlist (other than the floorplan objects of interest). The objective is to arrive at valid locations for the floorplan objects of interest, in order that subsequent steps of the chip physical design may be successfully completed. Present techniques are known to be ineffective in optimizing a floorplan design.

OBJECTS OF THE INVENTION

Thus, it is an object of the invention to provide a method to optimize the floorplan of a VLSI chip using a path based hyper-edge representation.

It is another object to provide a framework consisting of a path oriented abstract representation of detailed VLSI design netlists alongside with mechanisms for generating them efficiently, and appropriate techniques for interfacing with, and for driving optimization based floorplanning algorithms It is still another object to improve the efficiency of the floorplanner by reducing the complexity of an annealing based floorplanner working within a path based abstraction flow.

It is a further object to execute the abstraction phase by abstracting the leaf level logic (to reduce the solution space of the floorplanner) and reintroduce them in the form of floorplan constraints (to account for the presence of the leaf level logic while determining the location of large blocks).

It is yet another object to achieve by way of abstraction a significant improvement in the performance of a simulated annealing based floorplanner.

SUMMARY OF THE INVENTION

In a first aspect of the invention, there is described an abstraction based methodology to floorplanning. The abstraction method employs a hybrid, controlled path enumeration approach to generate a model that is used by the floorplanner. The abstraction methodology retains all the floorplan objects of the model that are of interest, while the abstracted cells in the input netlist are represented as directed hyper-edges with constraint annotations. The representation of abstracted cells as attributed hyper-edges, instead of complex (i.e., hierarchical) blocks, helps to preserve the signal path oriented behavior of the design, communicating it to the floorplanner. The physical design task of floorplanning is typically unaware of the structure of design netlist that is being floorplanned. The path based abstraction technique of the present invention also provides structural properties (path information between specific floorplan objects of interest) of the netlist to the floorplanner. This is done without any significant sacrifice in the quality of the resulting solutions.

The concept of path based netlist abstraction and net bundling are an essential aspect of the abstraction process. Netlist abstraction (described above) prunes the solution space by identifying objects of interest from the netlist and determining the connectivity between them. The net-bundling step significantly reduces the time taken for evaluating the floorplan solution quality by efficiently handling the connectivity information between objects of interest.

In another aspect of the invention, there is provided a method for optimizing a floorplanner for a design netlist representation of an integrated circuit (IC) chip that includes the steps of: a) generating an abstract netlist; b) bundling the abstract netlist resulting in a reduced abstract netlist; c) generating constraints for the floorplanner; and d) modeling the constraints in the floorplanner to place floorplan objects of interest on the chip layout.

BRIEF DESCRIPTION OF THE DRAWINGS

These and other objects, aspects and advantages of the invention will become apparent from the following detailed description of the invention when taken in conjunction with the accompanying figures.

FIG. 3c shows the result of applying net bundling, and the final annotated abstract netlist according to the invention, on the portion of the design netlist described in FIG. 3a.

FIGS. 4a–4c show a detailed view of the abstract netlist generation step of FIG. 2, according to the invention.

FIGS. 5a–5c show a detailed view of the net bundling step which results in generating the bundled abstract nets.

DETAILED DESCRIPTION OF THE INVENTION

Figure 2:
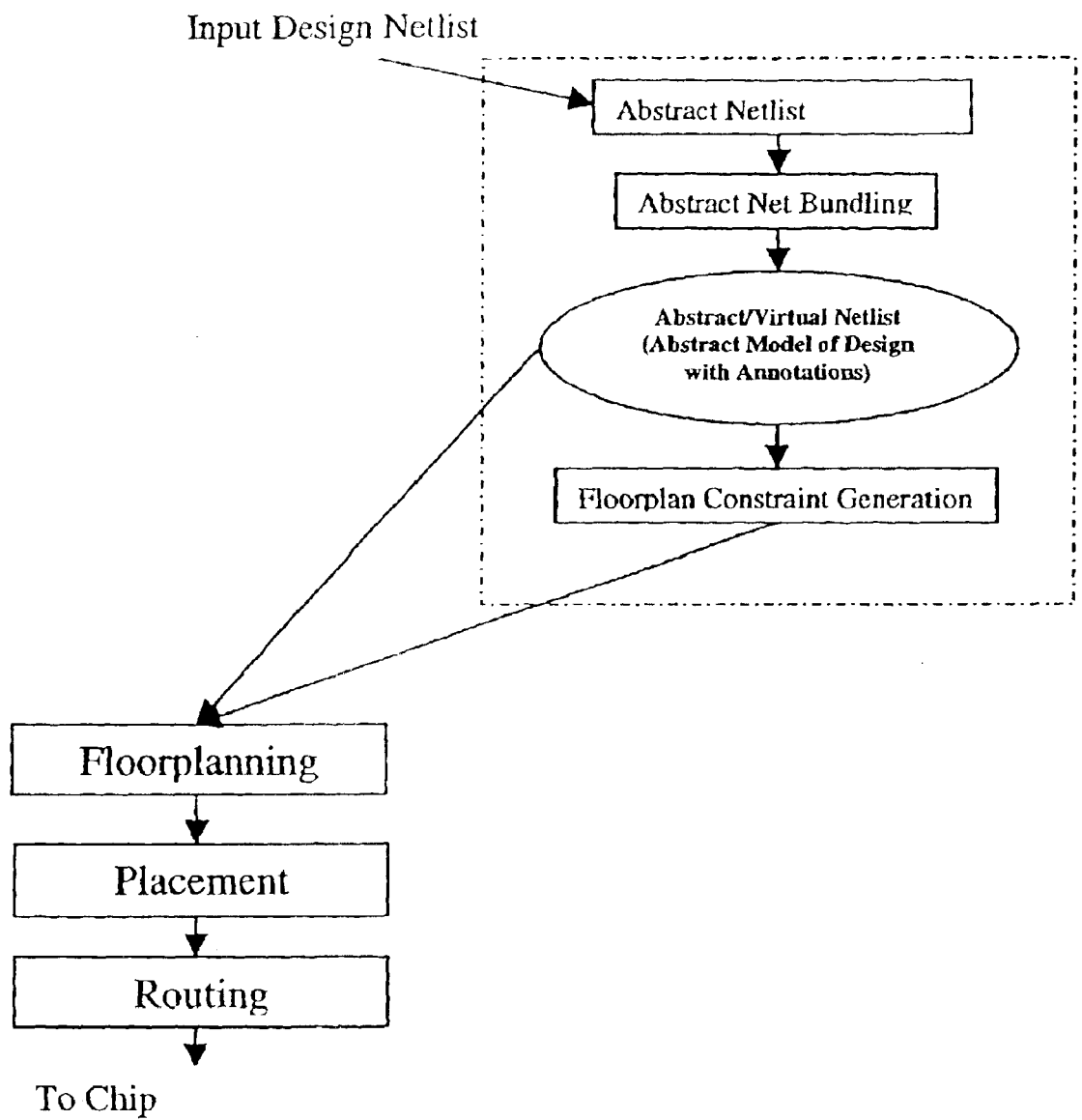
FIG. 2 shows the overall flow of the path abstraction based floorplanning in the context of an overall physical design methodology, according to the present invention.

FIG. 2 shows the overall flow of the path abstraction based floorplanning in the context of an overall physical design methodology, according to the present invention.

Figure 1:
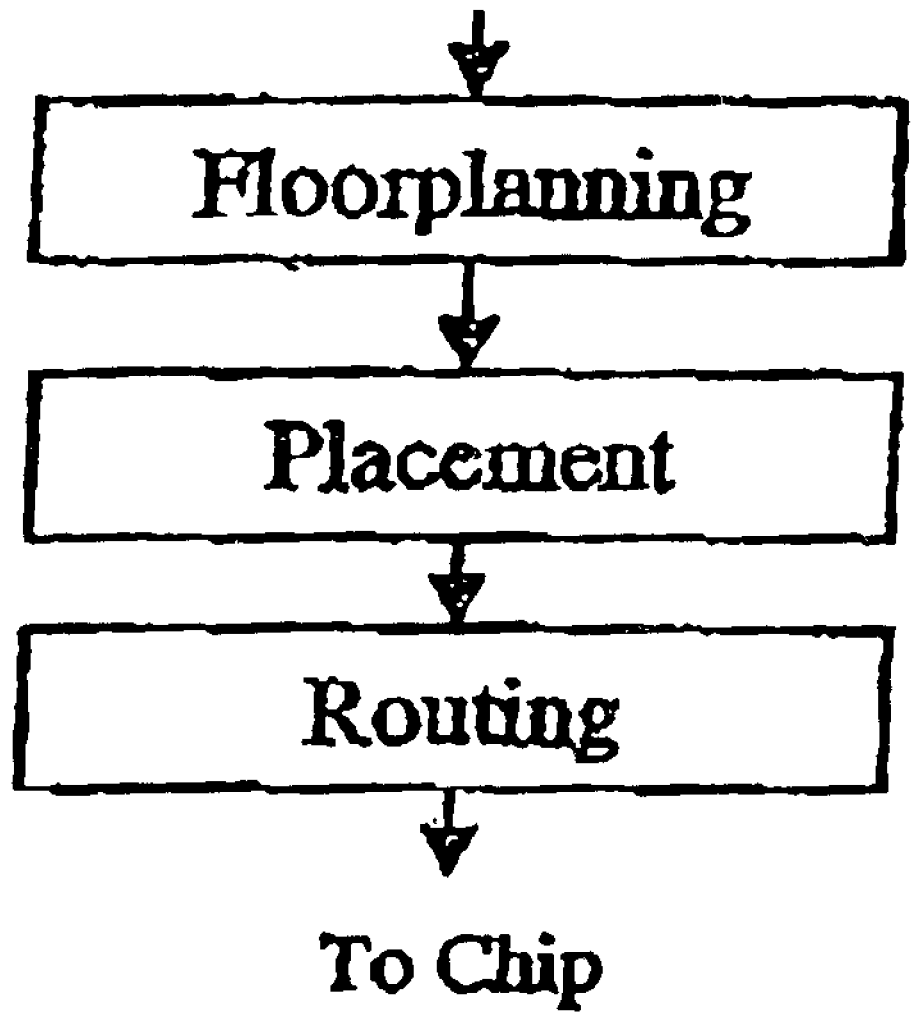
FIG. 1 is an overview of a conventional physical design flow, consisting of the steps of floorplanning, placement and routing.

For clarity sake, the inventive steps are placed within the context of a conventional physical design flow (FIG. 1). The main steps are highlighted within a dashed box shown on the top right hand side of FIG. 2. From the input design netlist, an abstract/virtual model of the netlist is constructed. The floorplanning step uses the virtual model of the netlist (instead of the detailed design netlist) and constraints computed by the floorplan constraint generation step in order to determine locations for the floorplan objects of interest. The coordinates of the floorplan objects as determined by the floorplanner make use of the virtual model to update locations of the objects in the original design netlist. The remaining physical design steps, i.e., placement and routing, utilize floorplan information from the updated design netlist.

The virtual model of the design netlist will be referred to hereinafter as "annotated abstract netlist", "annotated abstract hypergraph" or, simply, "abstract netlist". Objects are referred to as nodes or vertices, and the connections, hyper-edges. Nodes of the "annotated abstract hypergraph" (representing a virtual model of the design netlist) are designated "floorplan objects of interest" and hyper-edges are referred to as connections between floorplan objects of interest. (Note: A hypergraph is a data structure that represents a set of objects and connections linking them). The hyper-edge is also provided with annotations (or attributes) associated with it, with the annotations representing attraction and repulsion constraints (which are used by the floorplan optimization algorithm) between objects that are connected by the hyper-edge. (The terms abstract netlist and abstract hypergraph may be used interchangeably).

Figure 3A:
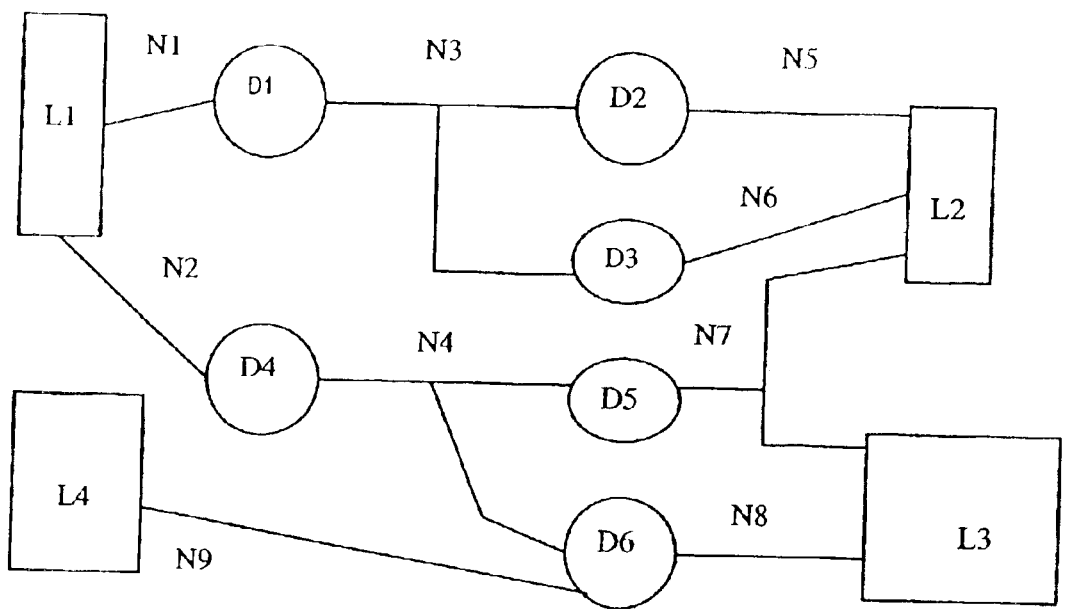
FIG. 3a is an illustrative design netlist, consisting of four floorplan objects of interest, eight leaf level cells and nine nets connecting these design objects.

Referring to FIG. 3a that illustrates a sample design netlist, boxes referenced by L1, L2, L3 and L4 denote the "floorplan objects of interest", whose locations on the chip are to be determined by floorplanning. Circles identified as D1, D2, D3, D4, D5 and D6 denote the dust logic or leaf cells in the netlist. Lines referenced by N1, N2, N3, N4, N5, N6, N7, N8 and N9 represent nets or connections between design objects in the netlist.

Referring back to the dashed box on the top right hand corner of FIG. 2, the process of creating the virtual model of the detailed design netlist, consists of an abstract netlist generation step followed by net bundling. Construction of the virtual model is initiated when the abstract netlist generation step is applied to the illustrative example design netlist. Floorplan objects of interest are identified in the original design netlist, a process referred to as "marking". For the example of FIG. 3a, the marked floorplan objects of interest are design objects L1, L2, L3, and L4.

The abstract netlist generation step consists of a tracing algorithm that is executed on the original netlist. The tracing algorithm starts from a floorplan object of interest searching for a path leading to another object of interest. A path (i.e., a sequence of design objects, such as leaf cells or dust logic—cells other than the marked floorplan objects of interest) and real interconnections (or nets) in the original netlist) begins at a floorplan object of interest and ends on a second floorplan object of interest. In the present example, the path shown is a sequence starting in floorplan object of interest L1, proceeding through N1, D1, N3, D2, and N5, ending in the floorplan object of interest L2. The abstract netlist generation step identifies all the paths in the design netlist between marked floorplan objects of interest. All the paths that are identified as a result of the abstract netlist generation step for the example netlist in FIG. 3a are:

Path 1: L1, N1, D1, N3, D2,N5, L2:
Path 2: L1, N1, D1, N3, D3, N6, L2:
Path 3: L1, N2, D4, N4, D5, N7, L2:
Path 4: L1, N2, D4, N4, D5, N7, L3:
Path 5: L1, N2, D4, N4, D6, N8, L3:
Path 6: L4, N9, D6, N8, L3.

Figure 3B:
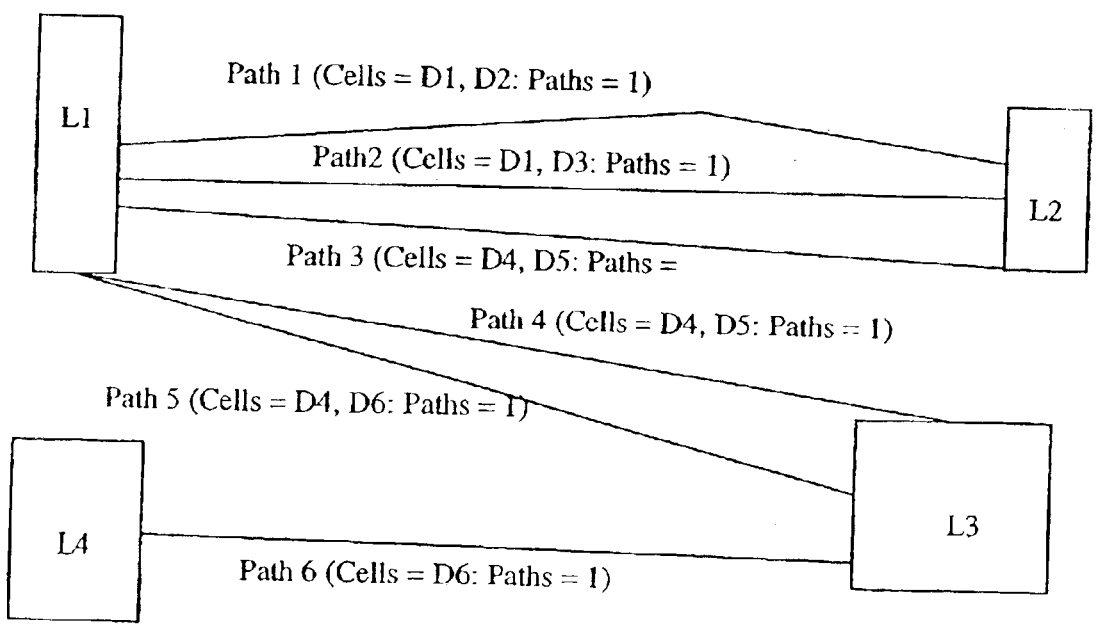
FIG. 3b shows the result of applying the path based netlist abstraction technique to the design netlist of FIG. 3a before bundling.

The result of applying the abstract netlist generation step on the design netlist is shown in FIG. 3b. The step of identifying all the paths between floorplan objects of interest may result in multiple paths between the same two floorplan objects of interest. Hereinafter, paths having the same starting and ending floorplan objects of interest will be referred to as "parallel" paths or connections. Parallel paths can be advantageously grouped by way of net bundling to reduce the total number of connections in the abstract netlist that is generated.

Figure 3C:
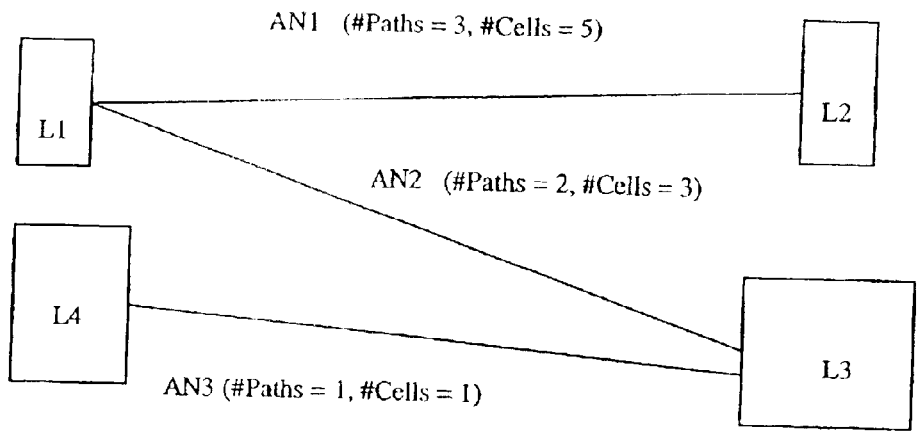

The task of net bundling is performed immediately following the execution of the tracing algorithm in the abstract netlist generation step. Applying net bundling to the result of the abstract netlist generation step generates the final "annotated abstract hypergraph" or "annotated abstract netlist" as shown in FIG. 3c. Multiple parallel connections (paths) existing between floorplan objects of interest (FIG. 3b) are collapsed into a single connection or abstract hyper-edge, having a width that corresponds to the number of individual paths that were merged. By way of example, in FIG. 3b, the three connections between L1 and L2 are merged into a single annotated abstract hyper-edge (connection—with the corresponding path count and unique cell count annotations). Annotations on abstract hyper-edges consist of two parts and provide the following information: 1) the total number of paths between the two objects of interest, and 2) the number of cells on the longest path between objects of interest. The latter may contain information such as the total number of unique cells among all the paths between two objects of interest.

Still referring to FIG. 3c, the first abstract hyper-edge, denoted by AN1 connects cell L1 and L2. The annotation (#Paths=3, #Cells=5) on abstract net AN1 is formed by the previously described merging of paths 1, 2, and 3. The second part of the annotation denoted by #Cells=5 denotes the list of cells D1, D2, D3, D4, and D5, resulting from merging paths 1, 2, and 3. In an alternate representation, the second part of the abstract hyper-edge annotation, may also be expressed in terms of the total area of the cells instead of the count, without any loss of generality.

Interpretation of Abstract Netlist by the Floorplanner

The next step generates floorplan constraints using the abstract netlist created in earlier steps. As previously described, the goal of floorplanning is to find locations for all the floorplan objects of interest identified in the abstract netlist. Connectivity between floorplan objects of interest serves as one aspect of the constraints for the floorplanner. These constraints dictate how close the floorplan objects of interest should be, i.e., the "attraction" constraints between them. Another aspect of the constraints is to model the space needed for the design objects not present in the abstract netlist. These space requirements are modeled as "repulsion" constraints between floorplan objects of interest.

As mentioned earlier, the simulated annealing engine serves as a basis for the floorplanner. Practitioners of the art will readily realize that other optimization techniques may be used for this purpose as well as for placing objects of interest. The objects are floorplanned such that the attraction constraints draws them in close proximity to each other when placed on the chip layout. Each attraction constraint is modeled as a connection with a weight proportional to the number of paths between the objects of interest (determined during the abstract netlist generation step). The floorplanner then minimizes the length of the connections representing the attraction constraints. Repulsion constraints are modeled by the artificial area expansion of the floorplan objects of interest. With reference to the abstract netlist shown in FIG. 3c, the area of the floorplan objects of interest L1 and L2 are expanded to account for the design objects: D1, D2, D3, D4, and D5, that were removed during the netlist abstraction step.

Figure 3D:
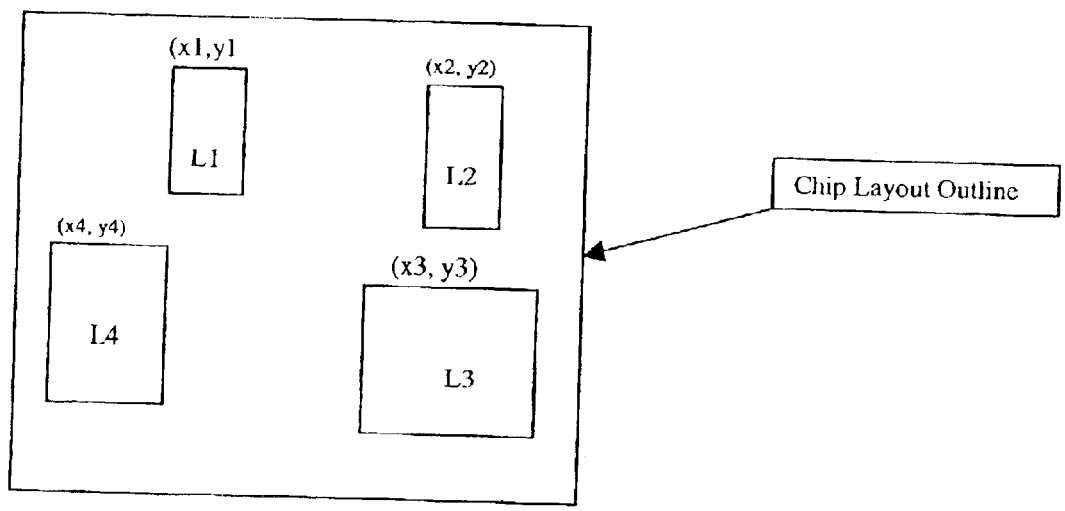
FIG. 3d shows the result of floorplanning the abstract netlist.

Information related to connections between floorplan objects of interest is provided to the floorplanner by the abstract netlist. This is illustrated in FIG. 2, where the arrow leaving the oval represents the abstract netlist to the floorplanner. Annotations on the abstract hyper-edges of the abstract netlist are used in the floorplan constraints generation step, to obtain the aforementioned attraction and repulsion constraints that are directly used by the floorplanner. In FIG. 2, this is shown by the arrow between the output of the floorplan constraint generation step to the floorplanner. The output of the floorplanner are locations of the floorplan objects of interest on the chip layout. For the example illustrated in FIG. 3a, the floorplan is shown in FIG. 3d. Therein, floorplan objects of interest L1, L2, L3 and L4 are assigned locations (x1, y1), (x2, y2), (x3, y3), and (x4, y4) on the two-dimensional layout of the chip.

Hereinafter, details pertaining the main objectives of the invention, such as abstract netlist generation, net bundling, floorplan constraint generation and floorplanning steps will be described.

Creation of the Abstract Netlist

In this section, the main algorithm that creates an abstract netlist from a given design netlist will be explained with reference to the dashed box in the top right hand corner of FIG. 2.

The abstract netlist generation step starts following a description of the algorithm. Shown in FIG. 4 is a top level view of the abstract netlist generation algorithm. There are two distinct phases in the abstract netlist creation process, namely:

Marking phase, where floorplan objects of interest are identified in the design netlist, and Abstract network generation or tracing phase, wherein paths between floorplan objects of interest are identified as abstract or virtual interconnections between objects.

The result of the marking phase is a list of design objects: the marked object of interest list. The network generation phase accepts the list of floorplan objects of interest and computes the set of paths among the floorplan objects of interest. The output of the abstract network generation phase is a list of abstract hyper-edges (or abstract nets representing the paths). The abstract hyper-edge is a data structure consisting of the following information:

Source floorplan object of interest;

Destination floorplan object of interest;

List of unmarked objects (design objects in the netlist that are not floorplan objects of interest), existing in the path between the source and destination floorplan objects of interest;

Number of paths between source and destination; and

The abstract network generation phase performs a path enumeration starting from each of the marked floorplan objects of interest. Path enumeration is known to be a problem that increases exponentially. In order to limit the complexity of the problem, the abstract network generation algorithm is provided with parameters to control the execution of the algorithm. These will be discussed hereinafter along with the abstract network generation algorithm.

Marking Phase

The marking phase refers to the process of identifying floorplan objects of interest in the original design netlist. Classes of objects/individual objects are identified and marked on the original netlist. The classes of objects most commonly supported are: latches, IOs, macros, large objects, and fixed objects. Individual objects of interest may also be marked in a given design netlist (i.e, an abstract netlist includes marked objects of interest falling into more than one of the categories).

The marking process can be static or dynamic. For the static case, objects of interest are predetermined and the subsequent network generation algorithm does not have any control over which objects of interest are to be marked (i.e., start/stop points for the abstract network tracing algorithm). For the illustrative netlist shown in FIG. 3(a), the design objects L1, L2, L3, L4 are identified as floorplan objects of interest. The output of the marking phase for this example is the list of floorplan objects of interest (<L1, L2, L3, L4>) which is used by the next phase of abstract network generation. This illustrates static marking, where the list of floorplan objects of interest are not changed, remaining the same throughout the process of floorplan object of interest identification (marking), abstract network generation (tracing), and the like. Static marking is the most commonly used mode of performing the marking process.

Static Marking

Cells are marked by the function:

markCells(CELLTYPE), where CELLTYPE is {IO, MACRO, LATCH, LARGEOBJECT, FIXED}.

This function marks all the cells that fall within a particular type of cell. The function identifies a large object based on the number of circuit rows occupied by it; a macro, by the presence of any child elements within; IO and latches based on their cell property. Once identified, these cells are tagged in the design netlist to be objects of interest. The result of the marking process is shown on the top right hand side of FIG. 4b. Therein is shown the illustrative design netlist introduced in FIG. 3a following the marking process. In FIG. 4b, the marked floorplan objects of interest, i.e., L1, L2, L3, L4, are depicted by dashed boxes. Cells are also individually marked. Typically, for the floorplanning, I/Os, macros and large objects are marked to be of interest. (These are the objects whose location on the layout needs to be determined by the floorplanner).

Dynamic Marking

In the case of static marking, the list of identified floorplan objects of interest are not modified during the marking process. In addition to the floorplan objects of interest, one may also determine that some design objects (not identified to be a floorplan object of interest) need to be marked as additional floorplan objects of interest in order to improve the abstract netlist being generated. The identification of these additional floorplan objects of interest based on properties of the design netlist is referred to as "Dynamic Marking". The basic property used for identifying additional floorplan objects of interest requires that the total number of inputs and outputs from a single design object exceed a pre-defined threshold. (if certain design objects in the netlist have a high number of pins associated with them). If this property is satisfied and the design object satisfying this property has not already been marked, then the additional design object becomes a primary candidate for marking.

Network Generation Phase

This phase refers to the task of generating the abstract network between objects of interest that were marked in the previous phase. The basic network generation algorithm is a modified depth first search on the design netlist. The algorithmic process, GenerateAbstractNetwork, addresses the main abstract netlist (hypergraph) generation as follows:

INPUT: Design Netlist, Vector of Marked Floorplan Objects of Interest.

OUTPUT: Abstract Netlist—Vector of Abstract Hyper-edges

---

Algorithm *GenerateAbstractNetwork* (DesignNetlist *netlist*, FOIVector *foiVector*)
   1. START
   2. IF nodeVector is not empty THEN
      a. FOR each design object *d* in *nodeVector*
         I. *d.visited* = FALSE
      b. END FOR
   3. END IF
   4. *nodeVector* = { }
   5. *abstractHyper-edgeVector* = { }
   6. *hyper-edgeVector* = { }
   7. FOR each foi in foiVector DO
      a. FOR each net *n* incident to *foi* DO
         i. *hyper-edgeVector* = *traceNets(n, foi)*
         ii.*abstractHyper-edgeVector* = *abstractHyper-edgeVector* + *hyper-edge Vector*
      b. END FOR
   8. END FOR
   9. END

---

The algorithm 'generateAbstractNetwork' accepts the design netlist and a vector of marked floorplan objects of interest. The vector is a standard data structure that contains a list of elements of a given type. It provides random access to elements, allows for a constant time insertion, removes elements at the end of the vector, and provides linear time insertion and removal of elements at the beginning or in the middle of the vector. A vector can, generally, be viewed as having the same meaning as a linked list. More information regarding vectors can be found in a C++ Text, like "The C++ Programming Language" by Bjarne Stroustrup.

Steps 2–6 of the algorithm are initialization steps. Each design object has a flag referred to as "visited" associated with it. The flag is set during the recursive tracing algorithm traceNet, if the particular design object was visited during the process. The nodeVector is a vector of design objects (which are not floorplan objects of interest) that were abstracted in the process of searching for a path to other floorplan objects of interest from the starting floorplan object of interest (foi). This nodeVector is constructed as a result of executing traceNet on each of the floorplan objects of interest belonging to the vector containing the objects of interest. Step 7 addresses the main loop that encompasses the list of floorplan objects of interest, executing the traceNet for each net connected to the floorplan object of interest. The result of executing traceNet is the creation of a vector of abstract hyper-edges representing alternate paths from certain floorplan objects of interest to other floorplan objects of interest. The list of hyper-edges obtained from a single call to traceNets is merged into the global list of abstract hyper-edges, represented by the variable abstractHyper-edge Vector. Step 7ii illustrates the merging step.

For the example illustrated with reference to FIG. 3(a), following completion of the marking process, the input to GenerateAbstractNetwork is a vector containing the four floorplan objects of interest L1, L2, L3, L4. TraceNet is executed for each of the objects. For instance, for object L1 (FIG. 3a), in Step 7 of GenerateAbstractNetwork, there are two calls made to traceNet, one to net N1, and the other to net N2. The first call traceNet(L1, N2) results in a vector of abstract hyper-edges. Referring to FIG. 3b, the vector of abstract hyper-edges contains two paths: path1 and path2. The second call to traceNet with floorplan object of interest L1, traceNet(L1, N2) (i.e., with net N2) results in a vector of abstract hyper-edge containing path3.

---

Algorithm *traceNet*(Net *n*, FOI *startFoi*)
1. BEGIN
2. IF *n* is a special net THEN
   a. Return
3. ENDIF
4. IF (*logicLevels* > *LogicDepthConstraint*) THEN
   a. Return
5. ENDIF
6. FOR each design object *d* belonging to net *n* DO
   a. IF *d* is a floorplan object of interest THEN
     i. Create abstract hyper-edge *h*
     ii.    h.source = startFoi
     iii.   h.destination = d
     iv.   h.cluster = activePathVector
     v.    h.numpaths = 1
     vi.   hyper-edgeVector = hyper-edgeVector + h
   b. ELSE IF (*d.visited* == TRUE) THEN
     i. *loopCount* = *loopCount* + 1
   c. ELSE /* d is an unmarked design object in the netlist */
     i.    logicLevels = logicLevels + 1
     Ii.   Insert *d* into *activePathVector*
     iii.  Insert *d* into *node Vector*
     iv.   d.visited = TRUE
     v.FOR each net n1 connected to *d* DO
       1. *traceNet(n1, startFOI)*
     vi.   END FOR
     vii.  logicLevels = logicLevels −1
     viii.  Remove last element from the *activePathVector*
   d. ENDIF
7. END FOR
8. END

---

The above process traceNet recursively traces the nets for each marked floorplan object of interest, with the intent of finding paths between objects of interest. Certain controls exist with which the user controls the overall recursive tracing process. The user can opt to ignore tracing from special nets. Clocks or scan nets having a very large fan-out are examples which the user may ignore while creating the abstract netlist. Other commands may be used to control the tracing that imposes a limit on the logic depth. If this constraint is set by the user, then the tracing algorithm identifies only those paths (between the floorplan objects of interest) having the total number of unmarked design objects thereon to be less than the constraint specified by the user. Steps 2, 4 of traceNet implement these controls in the tracing process. The variable logicDepthConstraint in step 4 reflects the user defined logic depth constraint. If the current number of logic levels (kept track of in the variable logicLevels by the tracing process in Algorithm traceNet) exceeds this constraint, then the tracing process is brought to a stop.

The FOR loop in step 6 addresses each design object connected to the net. The IF statement in Step 6a checks whether the design object is a floorplan object of interest. If the answer is Yes, then an abstract hyper-edge (path) is established between startFoi (the floorplan object of interest with which the tracing process started) and d (the current design object). Referring to FIG. 3b, this step of the algorithm creates an abstract hyper-edge (path1 in FIG. 3b) between L1 and L2, and sets the list of unmarked design objects (that have been abstracted away) on this abstract hyper-edge to be equal to D1 and D2. The variable activePathVector denotes the set of unmarked design objects that are currently in the path (abstract hyper-edge) being constructed by the tracing process. Each design object has a "visited" boolean attribute associated with it. This attribute indicates whether the design object was already reached and identifies that a loop was detected, which would then be ignored. The way of breaking loops among design objects is shown by the ELSE IF statement in Step 6(b) of traceNet. Step 6c shows the step of recursive stepping through unmarked design objects (non-floorplan objects of interest) of the netlist. The algorithm at Step 6c implies that the current design object d is not a floorplan object of interest, and that it is not a loop. In the sub-steps following Step 6c, the design object d is marked as visited, saved into activePathVector and nodeVector, and a recursive call is made from each net connected to the design object d, thereby seeing through or ignoring the non-floorplan objects of interest during the tracing process.

Figure 6:
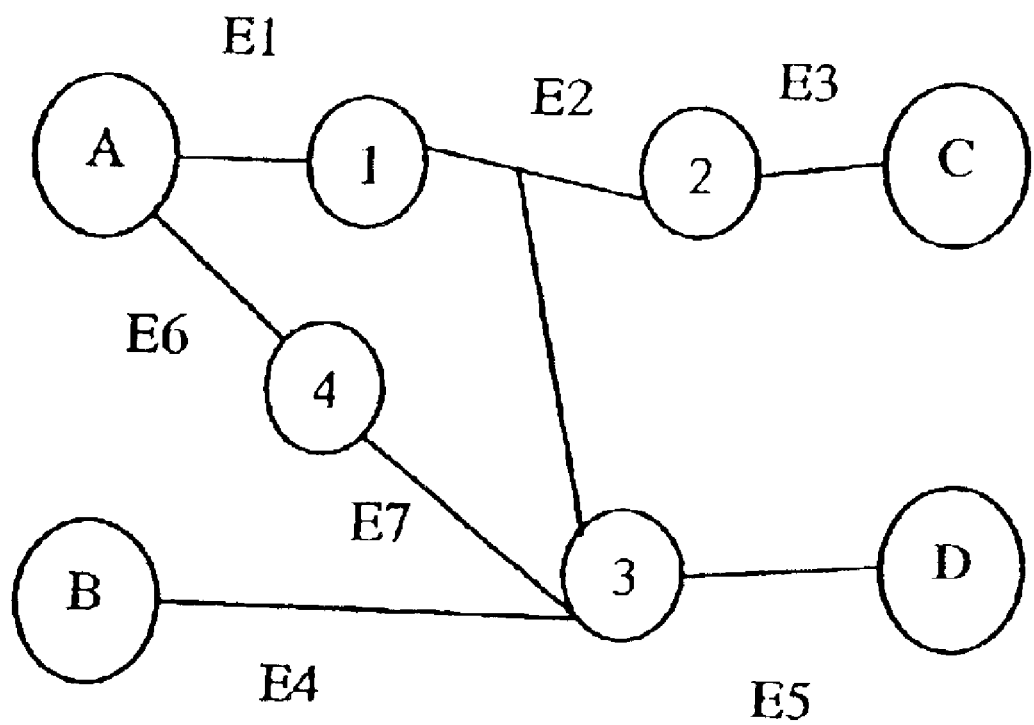
FIG. 6 shows an illustrative example of net tracing.

FIG. 6a shows an input hypergraph with marked vertices {A, B, C, D}. The top-level abstract network generation algorithm accepts such a hypergraph with marked vertices, invoking the recursive net tracing algorithm for each of the vertices A, B, C, D. Each vertex has the attribute visited. If it is set, it is an indication that the particular design object was visited during the recursive tracing.

Saving design objects being recursively stepped through into a "node vector" and resetting their visited attribute before calling TraceNet for the next marked floorplan object of interest in the top-level function ensures that all the paths between the floorplan objects of interest are represented in the final abstracted hypergraph. In the example of FIG. 6a, during the creation of abstract hyper-edges (A, C) and (A, D) in the first call of traceNet(A, E1), intermediate nodes 1, 2, 3 are marked visited. Had the node vector color resetting not been used, then the path (A, D) through nets E4, E6 and intermediate design object 4, would not have be found. This is because the net tracing algorithm starting from node B stops at node 3, as this node would already have been marked as visited. This example illustrates why a conventional depth first traversal is inadequate for the abstract hypergraph generation problem being solved by the abstract network generation algorithm presented herein.

The result of the abstract network generation algorithm is a vector of abstract hyper-edges that are represented as path1, . . . , path6, in FIG. 3b. The annotations on these abstract hyper-edges are used by the floorplan constraint generation phase to generate the constraints that drive the floorplanner. Thus, making the floorplanner aware of the intermediate logic that was abstracted allows the floorplanner to account for the real estate required to place the abstracted intermediate cells.

The next section describes the net bundling technique. Net bundling step identifies parallel connections and reduces the number of abstract hyper-edges in the network generated by the netlist abstraction process. Furthermore, during this process it generates the final annotations on the abstract hyper-edges.

Net Bundling

Once the abstract netlist is generated, other abstract nets or connections between the same sets of floorplan objects of interest may be put in place. For example, in FIG. 3b, the abstract netlist generation step created three abstract nets or interconnections between the floorplan objects of interest L1 and L2. A widely used metric to drive/evaluate a floorplanner is provided by the total interconnect wirelength (TWL). During the process of annealing, objects are moved around on the chip layout and the wirelengths are recomputed after each move to evaluate the quality of the floorplan. When a floorplan object is moved from its original position to a new position, the length of the nets connected to that object is no longer valid. In order to evaluate the goodness of this move, the length of the nets belonging to that object is recomputed. If the object contains a large number of terminals, then the process of recomputing the nets significantly increases the run-time. In order to reduce the run-time of the wirelength estimation and of the annealing algorithm, the concept of net-bundling is introduced. Net-bundling identifies "parallel edges" (connections) in the abstract netlist (or hypergraph) of the given design and bundles them as a single edge. Parallel connections are defined as connections in the netlist that link the same set of floorplan objects of interest. Referring to FIG. 3b, paths P1, P2 and P3 span between floorplan objects L1 and L2. Thus, these paths are parallel edges. The three paths can be merged into one (represented by AbstractNet AN1 in FIG. 3c). The formation of a single annotated hyper-edge: AN1 from three separate abstract nets denoted by path1, path2, and path3 is shown in FIGS. 5b and 5c.

Assuming that each path Pi is associated with a weight $W_{P_i}$. The weight reflects the criticality of the path. Then, the total weighted wirelength for all the paths between the floorplan objects L1 and L2 is:

$$WL_{(L1,L2)} = L_{P1}W_{P1} + L_{P2}W_{P2} + L_{P3}W_{P3},$$

where $L_{P1}$, $L_{P2}$ and $L_{P3}$ represent the length of the paths P1, P2 and P3, respectively.

In order to compute $WL_{(L1,L2)}$ without using net (or path) bundling, three multiplications and two additions are required. However, with net bundling, the three paths are represented as a single path bundle Pb with a weight $W_{pb}$ such that $$W_{pb} = W_{P1} + W_{P2} + W_{P3}.$$

The wirelength of path Pb is the same as that of paths P1, P2 and P3. Thus, the total weighted wirelength using path bundling is calculated as:

$$WL_{(L1,L2)} = L_{pb}W_{pb},$$

resulting in a only one multiplication. It can be seen that this result is the same as the one obtained by resorting to net bundling, except for certain redundant computations that were removed and which, in turn, reduced the time required for computing the wirelengths.

INPUT: List of Abstract Hyper-edges from Abstract Netlist Generation: ilist

OUTPUT: List of Abstract Hyper-edges with updated annotations after bundling: olist

```
Algorithm Net-Bundling
    1. BEGIN
    2. olist[0] = ilist[0]
    3. olistSize = 1
    4. FOR (ctr1 = 0; ctr1 < sizeof(ilist); ctr1++)
        a. ParallelEdgeFound = FALSE
        b. FOR (ctr2 = 0; ctr2 < olistSize; ctr2++)
            i. IF (isParallel(ilist[ctr1], olist
               [ctr2]) THEN
                1. olist[ctr2] = MergeHyper-edges
                   (ilist[ctr1], olist[ctr2])
                2. ParallelEdgeFound = true
                3. break
            ii.END IF
        c. END FOR
        d. IF (parallelEdgeFound == FALSE) THEN
            i. olistSize++
            ii.olist[olistSize] = ilist[ctr1]
        e. ENDIF
    5. END FOR
    6. END
```

The above algorithm provides an overview of net bundling. The input to this process is a vector of abstract hyper-edges that was created by the abstract netlist generation process. This is denoted by the variable ilist. The function isParallel accepts two abstract hyper-edges (e.g., path1, path2 in FIG. 5b) and checks whether the source and destination of both abstract hyper-edges is the same. If they are, it returns TRUE; otherwise, it returns FALSE. The MergeHyper-edges function in step 4.i.1 of the net bundling procedure accepts two abstract hyper-edges that are parallel, and increments the path count annotation between the source and destination floorplan objects of interest, merging the two lists of unmarked objects that occur on the hyper-edges being combined. Merging is achieved by removing duplicate design objects between the hyper-edges being merged. The cell count is correspondingly set by the size of the merged list of abstracted design objects. Referring to FIGS. 5b and 5c, net bundling results in generating the bundled abstract nets AN1, AN2, and AN3 along with the annotations from the list of paths: path1, path2, . . . , path6, that were generated by the abstract network generation step.

Floorplan Attraction-Repulsion Constraint Generation

The abstraction model modifies the original netlist in two ways. Firstly, it reduces the number of objects seen by the floorplanner, i.e., the number of objects requiring to be floorplanned are fewer than the number of placeable objects in the design. Secondly, the abstraction model removes nets from the original netlist and adds new nets in the abstract netlist seen by the floorplanner.

Following is described a method of modeling changes so that the floorplanner can be driven effectively.

Modeling the Abstract Nets as Attraction Constraints

The attraction between two floorplan objects depends on: 1) the number of paths between two objects, and 2) the number of objects abstracted out between them. The larger the number of paths, the higher the attractive force between the floorplan objects. However, if a large number of objects is abstracted between objects, then the attraction force loses some of its effectiveness. Thus, the attractive force $F_{A(i,j)}$ between two objects i and j is directly proportional to the number of paths (Np), and inversely proportional to the number of objects (Na) abstracted between them. Thus, if $K_A$ is a proportionality constant, then the force equation becomes:

$$F_{A(i,j)} = K_A(Np/Na)$$

Assuming $K_A = 1$, the attraction constraints for the example shown in FIG. 3c become $$F_{A(L1,L2)} = \frac{3}{5} = 0.60$$

$$F_{A(L1,L3)} = \frac{2}{3} = 0.67$$

$$F_{A(L4,L3)} = \frac{1}{1} = 1.00$$

Modeling the Abstracted Objects as Repulsion Constraints

Objects that are abstracted are real design objects that share the placement area with the floorplan objects of interest when the chip is completed. (An object in the design that is not a floorplan object of interest is referred to as an abstracted object) Thus, it is important to keep this factor in mind when floorplanning with an abstract netlist. If these objects were not considered, it is possible to generate a floorplan purely based on attraction constraints, and the floorplan objects may end being placed abutting with each other. This is an unsatisfactory solution and, thus, space must be allocated for the placement of objects that are abstracted out.

Allocation of space for abstracted logic is achieved by considering the area of design objects abstracted out. The total area of all the design objects that were abstracted in a path P is added, and proportionally distributed among the floorplan objects on that path. Alternatively, one may temporarily increase the size of the floorplan objects to account for the area of the abstracted objects. The area increase of the floorplan objects is proportional to the respective original areas. Since the abstracted objects appear in multiple paths, only a fraction of their areas for each path in which they appear will be distributed. Otherwise, more space is allocated than needed for the objects abstracted out. Thus, for e.g., if an abstracted object ai having an area Aai appears in three paths, then, an area is allocated equaling Aai/3 for each path where it appears.

Let $A_{(i,j)}$ be the sum total of the fractional area of all the objects abstracted out between floorplan objects i and j contained in path P. Let Ai and Aj be the original areas of the objects i and j, respectively. The area of objects i and j increases as follows:

$$Ai' = Ai + (Ai/(Ai+Aj))A_{(i,j)}$$

$$Aj' = Aj + (Aj/(Ai+Aj))A_{(i,j)}$$

where Ai' is the increased area of object i.

The increased areas for the objects L1 and L2 from path1 in FIG. 3b becomes $$A_{L1}' = A_{L1} + (A_{L1}/(A_{L1}+A_{1,2}))A$$

$$A_{L2}' = A_{L2} + (A_{L2}/(A_{L1}+A_{1,2}))A$$

where A is the fractional area of the two objects D1 and D2 abstracted out in the path1 between objects L1 and L2.

Each floorplan object thus get its area increased based on the objects abstracted out in each path which starts or ends with it. During floorplanning, the optimizer sees the increased size of the floorplan objects and generates a floorplan with spaces between them. A subsequent placement program can then place the abstracted out objects in the spaces created by the floorplanner.

Simulated Annealing Based Floorplanning

A solution to the floorplanning problem is positioning all the floorplan objects of interest on the chip layout. A multi-constrained floorplan optimization technique refers to a method of finding a placement solution for the floorplan objects of interest that optimizes a number of cost objectives. An important cost objective for a floorplanner is to minimize the total interconnection length. In the present case, attraction constraints introduced by the abstraction model are represented by weighted interconnection lengths. Also, for a given solution, the arrangement of the floorplan objects can be such that two or more of them may overlap. It is typical for any floorplanner to model the overlap score into the set of cost functions that are minimized. Overlaps are minimized as well. Thus, the cost function has two objectives to be minimized, which are: 1) attraction constraints represented as weighted interconnection lengths, and 2) the total overlaps. The cost function $C_s$ is represented for a given floorplan solution s as $$C_s = K_L L + K_O O$$

where $K_L$ and $K_O$ are constants, L is the total weighted interconnection length (of the abstraction constraints) and O, the total overlap score. Note that in this framework other constraints (such as timing, displacement, and the like) may be added to the cost function as well.

Simulated annealing can be advantageously used for the underlying floorplanner. Its randomized optimization allows modeling multiple constraints to drive the solution process. The annealing process begins with a random initial solution. The solution is then perturbed a large number of times to converge on a better solution that minimizes the cost objective. The final converged solution is shown to be for many instances near-optimal. The annealer accepts all the solutions that improve their quality, although it may also accept with some probability solutions that degrade the quality. This is the main reason for the annealing process to succeed. During early stages of annealing, larger perturbations are made to the solution and larger degradations are accepted. As the technique progresses, the perturbations become smaller and the accepted degradations become more stringent as well. The resulting solution provides location information of all the objects of interest having a high quality for a given cost objective (i.e., the total weighted interconnection length and overlaps are minimal). A subsequent verification step certifies the position (remove any remaining overlaps) of the floorplan objects. Thus, simulated annealing achieves an optimal arrangement of the floorplan objects of interest obtained with an awareness of the intervening objects that were abstracted out. The floorplan objects are then fixed in the chip layout and the placement tool is invoked to place other design objects on the chip layout. The result of floorplanning for the example shown in FIG. 3a is the arrangement of the floorplan objects of interest on the layout illustrated in FIG. 3d.

While the presented invention has been described in terms of a preferred embodiment, those skilled in the art will readily recognize that many changes and modifications are possible, all of which remain within the spirit and the scope of the present invention, as defined by the accompanying claims.

What is claimed is:

1. A method for optimizing a floorplanner for a design netlist representation of an integrated circuit (IC) chip layout, the netlist comprising a plurality of interconnected cells, the method comprising the steps of:

a) generating an abstract netlist comprised of a selected subset of cells of the design netlist while maintaining the signal flow properties of the design netlist;

b) adding to the abstract netlist constraints representing information regarding the remaining cells not included in the selected subset of cells; and c) modeling the constraints in the abstract netlist to drive the floorplanner to place the selected subset of cells in the IC chip layout.

2. The method as recited in claim 1 wherein step a) further comprises the steps of:

a1) identifying the selected subset of cells in the design netlist; and a2) generating abstract interconnections between the selected subsets of cells in the original design netlist, the abstract interconnections containing the signal flow properties of the remaining cells.

3. The method as recited in claim 2, further comprising the step of:

bundling the interconnections abstract in the abstract netlist to reduce the number of signal interconnections.

4. The method as recited in claim 1 wherein step b) further comprises the steps of:

identifying parallel interconnections within the abstract netlist; and merging the parallel interconnections into a single equivalent interconnection.

5. The method as recited in step a1) of claim 2, wherein the process of identifying the subset of cells in the original design netlist is performed statically or dynamically.

6. The method as recited in claim 1 wherein step b) further comprises the steps of:

annotating the path information between selected of cells onto the abstract netlist;

annotating the abstracted object information onto the abstract netlist; and respectively storing the annotated path information and abstract object the information as attraction and repulsion constraints on the abstract netlist.

7. The method as recited in step c) of claim 1 further comprising the steps of:

representing the attraction constraints as weights on the abstract interconnections; and modeling the repulsion constraints in the form of area expansion factors for the selected subset of cells in the design netlist.

8. The method as recited in step a) of claim 1, wherein the abstract netlist reduces the solution space of the floorplanner; and wherein by introducing the abstract netlist constraints, and wherein the presence of the leaf logic is accounted for while determining the location of large blocks within the IC design layout.

9. A program storage device readable by a machine, tangibly embodying a program of instructions executable by the machine to perform method steps for optimizing the allocation of resources for optimizing a floorplanner for a design netlist representation of an integrated circuit (IC) chip layout, the netlist comprising a plurality of interconnected cells, the method steps comprising a) generating an abstract netlist comprised of a selected subset of cells of the design netlist while maintaining the signal flow properties of the design netlist;

b) adding to the abstract netlist constraints representing information regarding the remaining cells not included in the selected subset of cells for bundling the remaining cells in the abstract netlist, thereby resulting in a reduced abstract netlist; and c) modeling the constraints in the abstract netlist to drive the floorplanner to place the selected subset of cells and the remaining cells in the IC chip layout based on the reduced abstract netlist.

* * * * *